United States Patent
Zhu et al.

(10) Patent No.: US 11,712,066 B2
(45) Date of Patent: Aug. 1, 2023

(54) MEASUREMENT CIRCUIT AND MEASUREMENT METHOD FOR MEASURING AND UPDATING A VOLTAGE RESOLUTION OF AN ELECTRONIC ATOMIZER CIRCUIT

(71) Applicant: WUXI CRYSTAL SOURCE MICRO ELECTRONICS CO., LTD., Wuxi (CN)

(72) Inventors: Weimin Zhu, Wuxi (CN); Zheng Jiang, Wuxi (CN); Hua Shen, Wuxi (CN)

(73) Assignee: WUXI CRYSTAL SOURCE MICRO ELECTRONICS CO., LTD., Wuxi (CN)

( * ) Notice: Subject to any disclaimer, the term of this patent is extended or adjusted under 35 U.S.C. 154(b) by 0 days.

(21) Appl. No.: 17/896,094

(22) Filed: Aug. 26, 2022

(65) Prior Publication Data

US 2022/0408837 A1 Dec. 29, 2022

(51) Int. Cl.
  *G01R 19/10* (2006.01)
  *A24F 40/53* (2020.01)
  *G01R 19/25* (2006.01)
  *H03K 17/687* (2006.01)

(52) U.S. Cl.
  CPC ............ *A24F 40/53* (2020.01); *G01R 19/10* (2013.01); *G01R 19/25* (2013.01); *H03K 17/687* (2013.01)

(58) Field of Classification Search
  CPC .......... A24F 40/53; A24F 40/50; A24F 40/51; A24F 40/60; A24F 47/00; A24F 40/40; A24F 40/30; A24F 40/10; A24F 13/12; G01R 19/10; G01R 19/25; G01R 19/255; G01R 19/257; H03K 17/687; H02J 7/0047; H02J 7/0063; H02J 7/007192; H02J 2207/20; H02J 7/0048; G06F 1/325;
  (Continued)

(56) References Cited

U.S. PATENT DOCUMENTS

| 6,040,560 | A | * | 3/2000 | Fleischhauer | A61M 11/04 219/494 |
| 6,053,176 | A | * | 4/2000 | Adams | A24F 40/53 131/329 |
| 9,099,873 | B2 | * | 8/2015 | Xiang | A24F 40/90 |

(Continued)

*Primary Examiner* — Vinh P Nguyen
(74) *Attorney, Agent, or Firm* — Richard Gerald Topolewski

(57) ABSTRACT

A measurement circuit and a measurement method for measuring and updating a voltage resolution of an electronic atomizer circuit are provided. In the measurement circuit, a comparison unit is configured to compare a first preset value and a second preset value to obtain a voltage difference, an accumulation and subtraction unit is configured to perform counting according to a comparison result, and a control unit is configured to adjust the voltage difference between two compared voltage input terminals, thereby calculating a voltage resolution of the control unit, avoiding the impact of the actual error of the first constant current source and the unit resistor on the actual voltage resolution, and ensuring the measurement accuracy. In addition, an accurate to-be-measured voltage is calculated, and a measurement value of the to-be-measured voltage is corrected, to ensure the high measurement accuracy of the to-be-measured voltage and the output power.

10 Claims, 8 Drawing Sheets

(58) Field of Classification Search
CPC . A24D 1/20; A24D 3/04; A24D 1/045; A24D 1/042; A24D 1/002
See application file for complete search history.

(56) References Cited

U.S. PATENT DOCUMENTS

| | | | |
|---|---|---|---|
| 9,814,263 B2* | 11/2017 | Cochand | A61M 15/06 |
| 10,986,875 B2* | 4/2021 | Fisher | H05B 1/0244 |
| 2016/0169947 A1 | 6/2016 | De Fazio et al. | |
| 2019/0257864 A1 | 8/2019 | McPhalen | |
| 2019/0257865 A1 | 8/2019 | McPhalen | |

* cited by examiner

MEASUREMENT CIRCUIT AND MEASUREMENT METHOD FOR MEASURING AND UPDATING A VOLTAGE RESOLUTION OF AN ELECTRONIC ATOMIZER CIRCUIT

FIELD OF TECHNOLOGY

The present invention relates to the technical field of electronic cigarettes, and in particular to a measurement circuit and a measurement method.

BACKGROUND

The electronic atomizer, generally referred to as the electronic cigarette, is an electronic product having the same appearance, smoke, taste and feel as the cigarette. After the nicotine is turned into vapor through atomization and the like, the user can smoke the electronic cigarette. In recent years, since an increasing quantity of people have begun to accept electronic cigarettes, people have increasingly high quantity requirements for the electronic cigarettes.

The electronic atomizer generally uses a constant average voltage, a constant root-mean-square value voltage, and a constant power output. Based on this, when the outputs of the electronic atomizer are sampled and measured, the existing measurement scheme is to use the successive approximation analog-to-digital converter (ADC) for the power supply voltage value of the battery, the output peak voltage and the resistance value of the electric heating ware. However, a large quantity of capacitive devices need to be fabricated in a measured chip, and occupy a large area of the wafer, resulting in high measurement costs and limited measurement accuracy.

SUMMARY

An objective of the present invention is to provide a measurement circuit and a measurement method, to reduce the measurement costs of the electronic atomizer, and improve the measurement accuracy and efficiency.

To achieve the foregoing objective, the present invention provides a measurement circuit, including a comparison unit, an accumulation and subtraction unit, and a control unit, where the comparison unit includes a first input terminal, a second input terminal, and an output terminal; the first input terminal is connected to a to-be-measured voltage or a first preset voltage, the second input terminal is connected to a reference voltage or a second preset voltage, and the output terminal is connected to the accumulation and subtraction unit;

the accumulation and subtraction unit is configured to perform accumulation or subtraction counting according to an output value of the comparison unit, and input a counting result into the control unit;

the control unit includes a first resistor series unit and a second resistor series unit, the first resistor series unit is connected to the first input terminal, and the second resistor series unit is connected to the second input terminal; and the control unit is configured to, according to the counting result, control the first resistor series unit or the second resistor series unit to be correspondingly connected to a resistance value of the first input terminal or the second input terminal, to adjust a voltage difference between the first input terminal and the second input terminal; and according to the counting result and a difference between the first preset voltage and the second preset voltage, a voltage resolution of the control unit is calculated, and according to the voltage resolution, the counting result, and the reference voltage, the to-be-measured voltage is calculated.

Optionally, in the measurement circuit, the first resistor series unit and the second resistor series unit each include $2^{n-1}$ unit resistors connected in series, the accumulation and subtraction unit performs counting in a binary manner, and n is a digit of the counting result.

Optionally, in the measurement circuit, the control unit further includes a first constant current source, a first switch array unit, and a second switch array unit; the first constant current source is connected to the first switch array unit and the second switch array unit; and the first switch array unit and the second switch array unit are connected to the first resistor series unit and the second resistor series unit respectively.

Optionally, in the measurement circuit, the first switch array unit and the second switch array unit each include $2^{n-1}$ switches connected in parallel, and two adjacent switches are connected to two terminals of a same unit resistor respectively; and a $2^{n-1}$th switch in the first switch array unit and a first switch in the second switch array unit are connected to two terminals of a $2^{n-1}$th unit resistor in the first resistor series unit; and a $2^{n-1}$th switch in the second switch array unit and the second input terminal are connected to two terminals of a $2^{n-1}$th unit resistor in the second resistor series unit respectively.

Optionally, in the measurement circuit, when the to-be-measured voltage is larger than the reference voltage or the first preset voltage is larger than the second preset voltage, the output value of the comparison unit is at a high level, the counting result of the accumulation and subtraction unit is incremented by 1, the first resistor series unit increases one unit resistor to be connected to the first input terminal, or the second resistor series unit reduces one unit resistor to be connected to the second, input terminal, to reduce the voltage difference between the first input terminal and the second input terminal by one voltage resolution; and when the to-be-measured voltage is smaller than the reference voltage or the first preset voltage is smaller than the second preset voltage, the output value of the comparison unit is at a low level, the counting result of the accumulation and subtraction unit is decremented by 1, the first resistor series unit reduces one unit resistor to be connected to the first input terminal, or the second resistor series unit increases one unit resistor to be connected to the second input terminal, to increase the voltage difference between the first input terminal and the second input terminal by one voltage resolution.

Optionally, in the measurement circuit, the voltage resolution and the to-be-measured voltage satisfy the following formula:

$$\Delta = (V\mathrm{ref}0 - V\mathrm{ref}1)/D; \text{ and}$$

$$Vp = Vn + M \times \Delta,$$

where $\Delta$ represents the voltage resolution, $V\mathrm{ref}0$ represents the first preset voltage, $V\mathrm{ref}1$ represents the second preset voltage, and D represents a difference between the counting result of the accumulation and subtraction unit and an initial count when the voltage resolution is measured; and $Vp$ represents the to-be-measured voltage, $Vn$ represents the reference voltage, and M represents a difference between the counting result of the accumulation and subtraction unit and the initial count when the to-be-measured voltage is measured.

Optionally, in the measurement circuit, the comparison unit includes a first transistor, a second transistor, a third transistor, and a fourth transistor; and the first input terminal is connected to a gate of the first transistor, the second input terminal is connected to a gate of the second transistor, the first resistor series unit is connected to a source of the first transistor, the second resistor series unit is connected to a source of the second transistor, a drain of the first transistor is connected to a drain, and the gate of the third transistor, a drain of the second transistor is connected to a drain of the fourth transistor and the accumulation and subtraction unit, a gate of the third transistor is connected to a gate of the fourth transistor, and a source of the third transistor and a source of the fourth transistor are both connected to the ground.

Optionally, in the measurement circuit, the first transistor and the second transistor are both PMOS transistors, and the third transistor and the fourth transistor are both NMOS transistors.

Optionally, in the measurement circuit, the comparison unit includes a first PMOS transistor, a second PMOS transistor, a third PMOS transistor, a fourth PMOS transistor, a first NMOS transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a first capacitor, a second capacitor, a second constant current source, a third constant current source, a fourth constant current source, a fifth constant current source, and a comparator;

a source of the first PMOS transistor, a source of the second PMOS transistor, a first terminal of the fourth constant current source, and a first terminal of the fifth constant current source are all connected to a power supply terminal, a gate and a drain of the first PMOS transistor are both connected to a gate of the second PMOS transistor, the drain of the first PMOS transistor is further connected to a drain of the first NMOS transistor and a drain of the second NMOS transistor, and a drain of the second PMOS transistor is connected to a drain and a gate of the seventh NMOS transistor, and a gate of the eighth NMOS transistor, and a gate of the ninth NMOS transistor; a source of the third PMOS transistor is connected to the first resistor series unit, a gate of the third PMOS transistor is connected to the to-be-measured voltage or the first preset voltage, a drain of the third PMOS is connected to a drain of the third NMOS transistor, a source of the tenth NMOS, and a drain of the fifth NMOS transistor; a source of the fourth PMOS transistor is connected to the second resistor series unit, a gate of the fourth PMOS transistor is connected to the reference voltage or the second preset voltage, and a drain of the fourth PMOS transistor is connected to a drain of the fourth NMOS transistor, a source of the eleventh NMOS transistor, and a drain of the sixth NMOS transistor; and a gate of the first NMOS transistor is connected to a second terminal of the fourth constant current source, a drain of the tenth NMOS transistor, and a non-inverting input terminal of the comparator; a gate of the second NMOS transistor is connected to a drain of the eleventh NMOS transistor, and an inverting input terminal of the cotnparator; a gate of the third NMOS transistor and the gate of the fourth NMOS transistor are both connected to a first signal; a gate of the fifth NMOS transistor and a gate of the sixth NMOS transistor are both connected to a second signal; phases of the first signal and the second signal are opposite; a source of the third NMOS transistor is connected to a first terminal of the second constant current source, a source of the sixth NMOS transistor, and a drain of the ninth NMOS transistor; a source of the fourth NMOS transistor is connected to a first terminal of the third constant current source, a source of the fifth NMOS transistor, and a drain of the eighth NMOS transistor; a gate of the tenth NMOS transistor is connected to a gate of the eleventh NMOS transistor; a source of the first NMOS transistor, a source of the second NMOS transistor, a source of the seventh NMOS transistor, a source of the eighth NMOS transistor, a source of the ninth NMOS transistor, a second terminal of the second constant current source, and a second terminal of the third constant current source are all connected to the ground; the first capacitor has one terminal connected to the inverting input terminal of the comparator, and the other terminal connected to the ground; the second capacitor has one terminal connected to the non-inverting input terminal of the comparator, and the other terminal connected to the ground; and the output terminal of the comparator is connected to the accumulation and subtraction unit.

Based on the same invention concept, the present invention further provides a measurement method for measuring an electronic atomizer circuit, including:

connecting a first input terminal of a comparison unit to a first preset voltage, and connecting a second input terminal of the comparison unit to a second preset voltage; within a first predetermined time period, performing, by an accumulation and subtraction unit, counting, adjusting, by a control unit, a voltage difference between the first input terminal and the second input terminal, to calculate a voltage resolution of the control unit, determining whether the voltage resolution is abnormal, and taking a preset value of the voltage resolution of the control unit to if the voltage resolution is abnormal;

measuring a resistance value of an electric heating wire in the electronic atomizer circuit, determining whether the resistance value is abnormal, if the resistance value is abnormal, replacing the electric heating wire, and remeasuring the resistance value of the electric heating wire;

measuring a to-be-measured voltage to obtain a measurement value, wherein the to-be-measured voltage at least comprises a power supply voltage, an output voltage and a terminal voltage of the electric heating wire of the electronic atomizer circuit;

connecting the first input terminal of the comparison unit to the to-be-measured voltage, and connecting the second input terminal of the comparison unit to a reference voltage; and within a second predetermined time period, performing, by the accumulation and subtraction unit, counting, adjusting, by a control unit, a voltage difference between the first input terminal and the second input terminal, to calculate an actual value of the to-be-measured voltage;

correcting the measurement value of the to-be-measured voltage according to the actual value of the to-be-measured voltage;

calculating output power of the electronic atomizer circuit according to the corrected value of the to-be-measured voltage; and after smoking, connecting the first input terminal of the comparison unit to the first preset voltage, and connecting the second input terminal of the comparison unit to the second preset voltage; within a first predetermined time period, performing, by the accumulation and subtraction unit, counting, adjusting, by the control unit, the voltage difference between the first input terminal and the second input terminal, to recalculate a voltage resolution of the control unit, determining whether the voltage resolution is abnormal, and updating the voltage resolution of the control unit as an original value before the smoking if the voltage resolution is abnormal.

In summary, the present invention provides the measurement circuit and the measurement method. The measurement circuit includes a comparison unit, an accumulation and subtraction unit, and a control unit, where a comparison unit is configured to compare a first preset value and a second preset value to obtain a voltage difference, an accumulation and subtraction unit is configured to perform counting according to the comparison result, and the control unit is configured to adjust the voltage difference of two voltage input terminals, thereby pre-calculating a voltage resolution of the control unit according to the calculation result, and a difference between the first preset voltage and the second preset voltage, avoiding the impact of the actual error of the first constant current source and the unit resistor on the actual voltage resolution, and ensuring the measurement accuracy. In addition, according to the reference voltage, a pre-measured the voltage resolution, and the counting result, a relatively accurate to-be-measured voltage can be obtained, to correct a measurement value of the to-be-measured voltage, thereby ensuring the high measurement accuracy of the to-be-measured voltage and the output power. In addition, the measurement method is simple to perform, which is beneficial to improve the measurement efficiency.

Further, the comparison unit and the control unit, include a plurality of transistors and unit resistors and few capacitor devices, reducing the manufacturing costs of the measurement circuit, and decreasing the area of the chip occupied by the measurement circuit. This is beneficial for integration.

Therefore, the measurement circuit and the measurement method provided by the present invention can not only reduce the measurement costs of the electronic atomizer, but also improve the measurement accuracy and the measurement, efficiency.

DESCRIPTION OF THE EMBODIMENTS

Hereinafter, regarding, the detailed content and technical description of the present invention, preferable embodiments are now used for further description, but should not be construed as a limitation on the implementation of the present invention. Some terms used in this specification and the claims are referred to as particular components, and can be understood by those of ordinary skills in the art. Hardware manufacturers may use different nouns to refer to the same component. This specification and subsequent patent applications do not use the difference in name as a way to distinguish components, but use differences in functions as a criterion for distinguishing components. The word "include/comprise" mentioned in the whole specification and the claims is an opening term, and therefore it should be interpreted as "include/comprise, but is not limited to". In addition, the word "coupled" here includes any direct and indirect electrical connection means. Therefore, if it is described in the text that the first loop is coupled to the second loop, it means that the first loop can be directly electrically connected to the second loop, or indirectly connected to the second loop through other components such as resistors.

Figure 1:
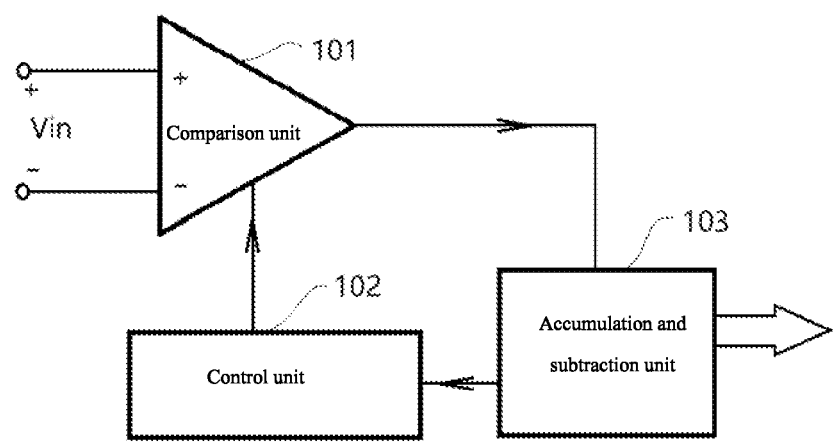
FIG. 1 is a schematic frame diagram of a measurement circuit, according to an embodiment of the present invention.
Figure 2:
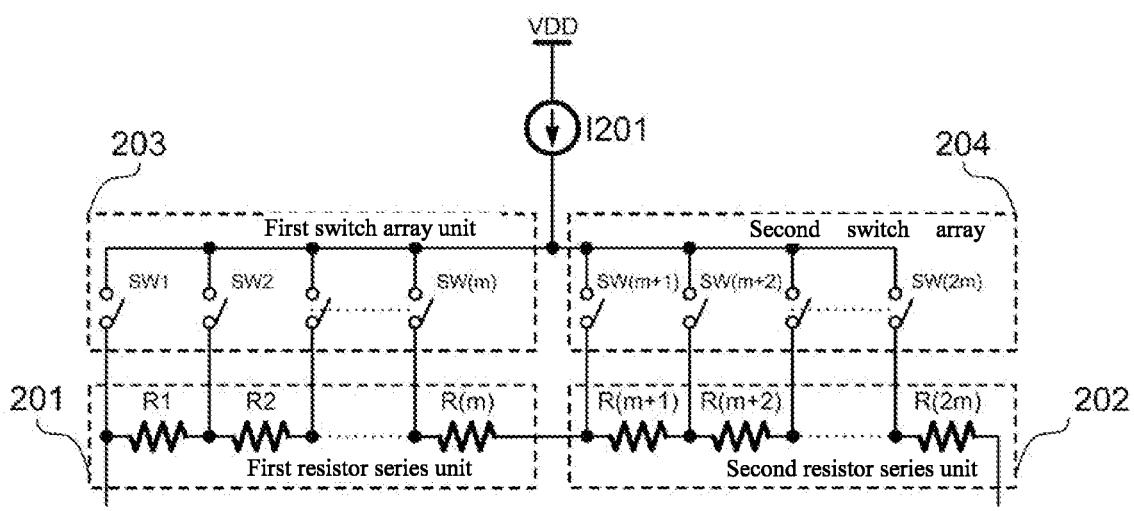
FIG. 2 is a schematic structural diagram of a control unit according to an embodiment of the present invention.

With reference to FIGS. 1 and 2, this embodiment provides a measurement circuit, including a comparison unit 101, a control unit 102, and an accumulation and subtraction unit 103. The comparison unit 101 includes a first input terminal, a second input terminal, and an output terminal; the first input terminal is connected to a to-be-measured voltage or a first preset voltage, the second input terminal is connected to a reference voltage or a second preset voltage, and the output terminal is connected to the accumulation and subtraction unit 103; the accumulation and subtraction unit 103 is configured to perform accumulation or subtraction counting according to an output value of the comparison unit 101, and input a counting result into the control unit 102; the control unit 102 includes a first resistor series unit 201 and a second resistor series unit 202, the first resistor series unit 201 is connected to the first input terminal, and the second resistor series unit 202 is connected to the second input terminal; and the control unit 102 is configured to, according to the counting result, control the first resistor series unit 201 or the second resistor series unit 202 to be correspondingly connected to a resistance value of the first input terminal or the second input terminal, to adjust a voltage difference between the first input terminal and the second input terminal; and according to the counting result and a difference between the first preset voltage and the second preset voltage, a voltage resolution of the control unit 102 is calculated, and according to the voltage resolution, the counting result, and the reference voltage, the to-be-measured voltage is calculated.

In the measurement circuit provided by this embodiment, a voltage resolution is pre-measured, avoiding the impact of the actual error of the first constant current source and the unit resistor on the actual, voltage resolution, and ensuring the measurement accuracy. In addition, according to the reference voltage, a pre-measured the voltage resolution, and the counting result, a relatively accurate to-be-measured voltage can be obtained, to correct a measurement value of the to-be-measured voltage, thereby ensuring the high measurement accuracy of the to-be-measured voltage and the output power. Further, the comparison unit 101 and the control unit 102 include a plurality of transistors and unit resistors and few capacitor devices, reducing the manufacturing costs of the measurement circuit, and decreasing the area of the chip occupied by the measurement circuit. This is beneficial for integration. Therefore, the measurement circuit provided by this embodiment can not only reduce the measurement costs of the electronic atomizer, but also improve the measurement accuracy and the measurement efficiency.

With reference to FIGS. 1 to 10, the measurement circuit provided in this embodiment is described specifically.

With reference to FIGS. 1 and 2, the comparison unit 101 includes a first input terminal, a second input terminal, and an output terminal. The comparison unit 10 is configured to compare the voltages Vin of the first input terminal and the second input terminal, and the first input terminal is a non-inverting input terminal, and the second input terminal is an inverting input terminal. The output terminal of the comparison unit 101 is connected to the accumulation and subtraction unit 103. Further, the accumulation and subtraction unit 103 is an accumulator, such that when the potential at the output terminal is at a high level, the accumulator increases by 1. When the potential at the output terminal is at a low level, the accumulator decreases by 1.

The control unit 102 is configured to, according to the counting result of the accumulation and subtraction unit 103, control the first resistor series unit 201 or the second resistor series unit 202 to be correspondingly connected to a resistance value of the first input terminal or the second input terminal, to adjust a voltage difference between the first input terminal and the second input terminal; and Further, the control unit 102 includes a first resistor series unit 201, a second resistor series unit 202, a first switch array unit 203, a second switch array unit 204, and a first constant current source I201. The first resistor series unit 201 includes $2^{n-1}$ unit resistors R1-R(m) connected in series, where m=$2^{n-1}$. Similarly, the second resistor series unit 202 includes $2^{n-1}$ unit resistors R(m+1)-R(2m) connected in series. Further, the accumulation and subtraction unit performs counting in a binary manner, and n is a digit of the counting result. For example, if an initial value of the accumulation and subtraction unit is 100000, that is, the digit=6, the first resistor series unit 201 and the second resistor series unit 202 each include $2^5$ unit resistors.

Further, the first constant current source I201 is connected to the first switch array unit 203 and the second switch array unit 204; and the first switch array unit 203 and the second switch array unit 204 are connected to the first resistor series unit 201 and the second resistor series unit 202 respectively. The first switch array unit 203 includes $2^{n-1}$ switches SW1-SW(m) connected in parallel. The second switch array unit 204 includes $2^{n-1}$ switches SW(m+1)-SW(2m) connected in parallel. Two adjacent switches are connected to two terminals of a same unit resistor respectively. A $2^{n-1}$th switch SW(m) in the first switch array unit and a first switch SW(m+1) in the second switch array unit are connected to two terminals of a $2^{n-1}$th unit resistor R(m) in the first resistor series unit; and a $2^{n-1}$th switch SW(2m) in the second switch array unit and the second input terminal are connected to two terminals of a $2^{n-1}$th unit resistor R(2m) in the second resistor series unit respectively.

Based on this, when the switches in the first switch array unit 203 and the second switch array unit 204 are all closed, there is no resistor in the first resistor series unit 201, and the second resistor series unit 202 has only the resistor R(2m). With reference to FIG. 2, the switches in the second switch array unit 204 are opened sequentially from right to left. Every time a switch is turned on, a unit resistor is connected in series into the second resistor series unit 202. Similarly, the switches in the first switch array unit 203 are opened sequentially from left to right. Every time a switch is turned on, a unit resistor is connected in series into the first resistor series unit 201. If the switches in the second switch array unit 204 are all opened, m unit resistors are connected in series into the second resistor series unit 202. Similarly, if the switches in the first switch array unit 203 are all opened, m unit resistors are connected in series into the first resistor series unit 201.

Then, when the switches in the first switch array unit 203 and those in the second switch array unit 204 are closed separately, different resistors are connected into the first resistor series unit 201 and the second resistor series unit 202. If no resistor is connected into the first resistor series unit 201, and m unit resistors are connected into the second resistor series unit 202, the largest bias voltage is (m−1)×I201×R. Similarly, if m unit resistors are connected into the first resistor series unit 201, and no resistor is connected into the second resistor series unit 202, the largest bias voltage is −m×I201×R. The measurement range is −m×I201×R−(m−1)×I201×R, and the voltage resolution of the control unit 102 is Δ=I201×R, where R represents the unit resistor. For example, if the digit of the measurement output of the accumulation and subtraction unit is 6, the initial output value of the accumulation and subtraction unit 103 is 100000. If the comparison unit 101 outputs a high-level potential, the accumulation and subtraction unit 103 outputs +1. Under the control of the control unit 102, the potential of the first input terminal of the comparison unit 101 is decreased by a 1-voltage-resolution voltage, or the potential of the second input terminal is increased by a 1-voltage-resolution voltage. If the comparison unit 101 outputs a low-level potential, the accumulation and subtraction unit103 outputs −1. Under the control of the control unit 102, the potential of the first input terminal of the comparison unit 101 is increased by a 1-voltage-resolution voltage, or a potential of the second input terminal is decreased by a 1-voltage-resolution voltage. The measurement range of the measurement circuit is −32×Δ−31×Δ, where Δ represents the voltage resolution.

Figure 3:
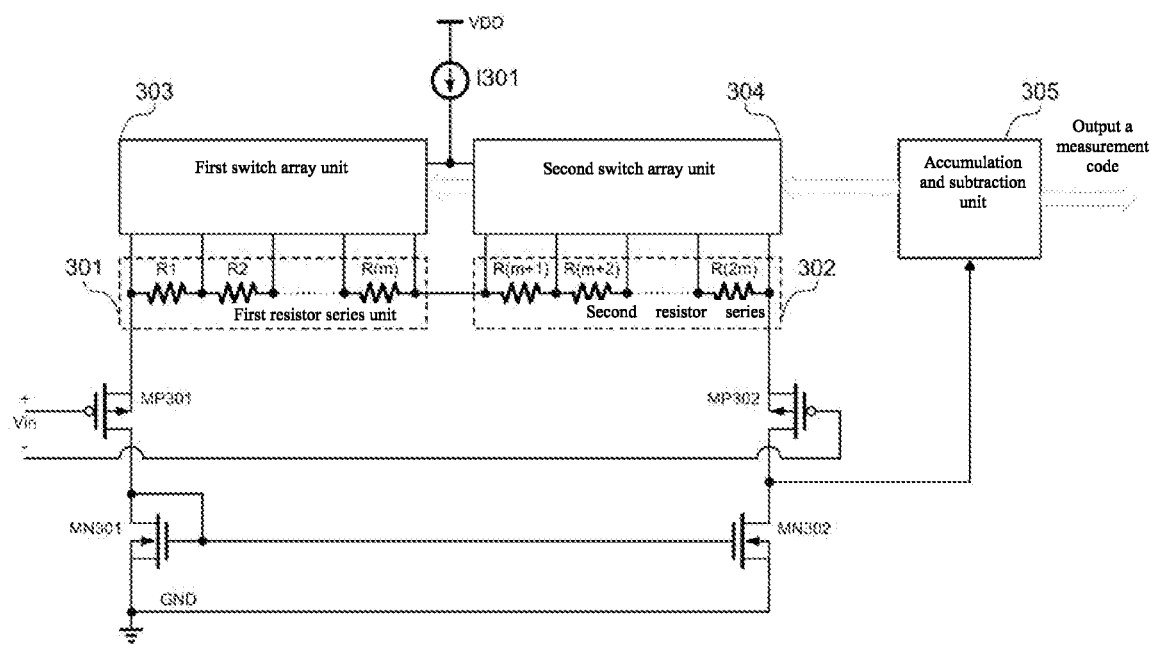
FIG. 3 is a schematic structural diagram of the measurement circuit according to an embodiment of the present invention.

Further, with reference to FIG. 3, in an embodiment, the comparison unit includes a first transistor MP301, a second transistor MP302, a third transistor MN301, and a fourth transistor MN302. The first input terminal is connected to a gate of the first transistor MP301, the second input terminal is connected to a gate of the second transistor MP302, the first resistor series unit 301 is connected to a source of the first transistor MP301, the second resistor series unit 302 is connected to a source of the second transistor MP302, a drain of the first transistor MP301 is connected to a drain and the gate of the third transistor MN301, a drain of the second transistor MP302 is connected to a drain of the fourth transistor MN302 and the accumulation and subtraction unit 305, a gate of the third transistor MN301 is connected to a gate of the fourth transistor MN302, and a source of the third transistor MN301 and a source of the fourth transistor MN302 are both connected to the ground. The first transistor MP301 and the second transistor MP302 are both PMOS transistors, and the third transistor MN301 and the fourth transistor MN302 are both NMOS transistors.

Based on this, when the to-be-measured voltage is larger than the reference voltage or the first preset voltage is larger than the second preset voltage, the output value of the comparison unit is at a high level, the counting result of the accumulation and subtraction unit 305 is incremented by 1, the first resistor series unit 301 increases one unit resistor R to be connected to the first input terminal, or the second resistor series unit 302 reduces one unit resistor R to be connected to the second input terminal, to reduce the voltage difference between the first input terminal and the second input terminal by one voltage resolution Δ. When the to-be-measured voltage is smaller than the reference voltage or the first preset voltage is smaller than the second preset voltage, the output value of the comparison unit is at a low level, the counting result of the accumulation and subtraction unit 305 is decremented by 1, the first resistor series unit 301 reduces one unit resistor R to be connected to the first input terminal, or the second resistor series unit 302 increases one unit resistor R to be connected to the second input terminal, to increase the voltage difference between the first input terminal and the second input terminal by one voltage resolution Δ.

For example, if the voltage resolution Δ=0.020 V, and electric potentials of the first input terminal and the second input terminal of the comparison unit are 1.050 V and 1.000 V respectively, the potential at the output terminal is at a high level. The accumulation and subtraction unit 305 adds 1. The control unit reduces the potential of the first input terminal by 0.020 V. In this case, the potentials of the first input terminal and the second input terminal are 1.030 V and 1.000 V respectively. If the potential at the output terminal of the comparison unit is still at a high level, the accumulation and subtraction unit 305 continues to add 1, and the control unit reduces the potential of the first input terminal by 0.020 V again. In this case, the electric potentials of the first input terminal and the second input terminal are 1.010 V and 1.000 V respectively. The potential of the output terminal of the comparison unit is still at a high level. Correspondingly, the accumulation and subtraction unit 305 continues to add 1. The control unit reduces the potential of the first input terminal by 0.020 V again. In this case, the electric potentials of the first input terminal and the second input terminal of the comparison unit are 0.990 V and 1.000 V respectively. The potential at the output terminal of the comparison unit is at a low level. Therefore, the accumulation and subtraction unit 305 subtracts 1, and the control unit increases the potential of the first input terminal by 0.020 V. In this case, the electric potentials of the first input terminal and the second input terminal are 1.010 V and 1.000 V respectively. The potential at the output terminal of the comparison unit is at a high level again.

In view of the error of the actual process, it is difficult for the unit resistor R to be the same as the calibration value, so it is difficult to ensure the accuracy of the voltage resolution Δ=I301×R. To resolve the foregoing problem, in the measurement circuit provided in this embodiment, the Δ is pre-measured. In other words, the first input terminal is connected to the first preset voltage Vref0, and the second input terminal is connected to the second preset voltage Vref1. Then, within a first preset time period, according to the counting result outputted by the accumulation and subtraction unit 305, that is, the measurement code D, Δ=(Vref0−Vref1)/D can be obtained. For example, if the potential at first input terminal connected to the first preset voltage Vref0 is 1.101 V, and the potential at the second input terminal connected to the second preset voltage Vref1 is 1.000 V, the accumulation and subtraction unit 305 decreases the potential at the first input terminal by 5 times, and the potential at the output terminal of the comparison unit, is changed to be at a low level from a high level. If the accumulation and subtraction unit 305 outputs 000101 (in the binary form), the voltage resolution is:

$$\Delta=(Vref0-Vref1)/D=(1.101-1.000)/5=0.020 V.$$

Therefore a voltage resolution Δ is pre-measured, which can avoid the impact of the process error of the first constant current source I301 and the unit resistor Ron the actual voltage resolution Δ, ensuring the measurement accuracy. In addition, the comparison unit and the control unit include a plurality of transistors and unit resistors and few capacitor devices, reducing the manufacturing costs of the measurement circuit, and decreasing the area of the chip occupied by the measurement circuit. This is beneficial for integration.

Figure 4:
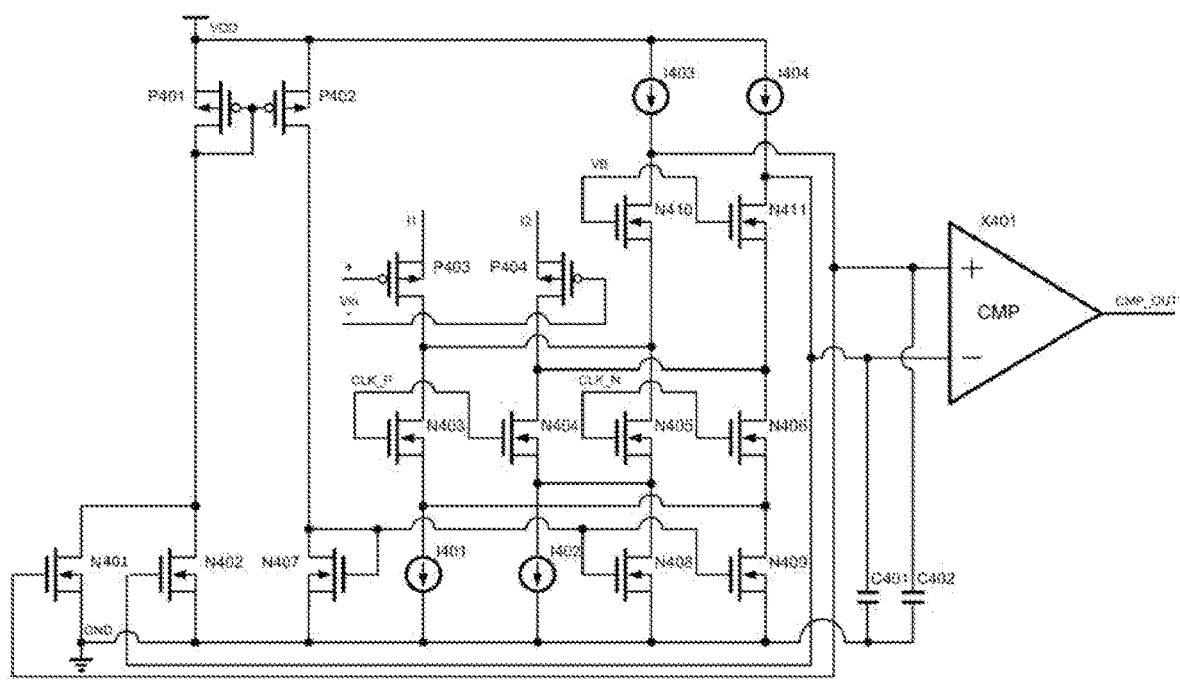
FIG. 4 is a schematic structural diagram of a comparison unit according to an embodiment of the present invention.

With reference to FIGS. 1, 2 and 4, in another embodiment, the comparison unit includes a first PMOS transistor P401, a second PMOS transistor P402, a third PMOS transistor P403, a fourth PMOS transistor P404, a first NMOS transistor N401, a second NMOS transistor N402, a third NMOS transistor N403, a fourth NMOS transistor N404, a fifth NMOS transistor N405, a sixth NMOS transistor N406, a seventh NMOS transistor N407, an eighth NMOS transistor N408, a ninth NMOS transistor N409, a tenth NMOS transistor N410, an eleventh NMOS transistor N411, a first capacitor C401, a second capacitor C402, a second constant current source I401, a third constant current source I402, a fourth constant current source I403, a fifth constant current source I404, and a comparator X401. A source of the first PMOS transistor P401, a source of the second PMOS transistor P402, a first terminal of the fourth constant current source I403, and a first terminal of the fifth constant current source I404 are all connected to a power supply terminal VDD, a gate and a drain of the first PMOS transistor P401 are both connected to a gate of the second PMOS transistor P402, the drain of the first PMOS transistor P401 is further connected to a drain of the first NMOS transistor N401 and a drain of the second NMOS transistor N402, and a drain of the second PMOS transistor P402 is connected to a drain and a gate of the seventh NMOS transistor N407, and a gate of the eighth NMOS transistor N408, and a gate of the ninth NMOS transistor N409; a source of the third PMOS transistor P403 is connected to the first resistor series unit 201, a gate of the third PMOS transistor P403 is connected to the to-be-measured voltage or the first preset voltage, a drain of the third PMOS P403 is connected to a drain of the third NMOS transistor N403, a source of the tenth NMOS N410, and a drain of the fifth NMOS transistor N405; a source of the fourth PMOS transistor P404 is connected to the second resistor series unit 202, a gate of the fourth PMOS transistor P404 is connected to the reference voltage or the second preset voltage, and a drain of the fourth PMOS transistor P404 is connected to a drain of the fourth NMOS transistor N404, a source of the eleventh NMOS transistor N411, and a drain of the sixth NMOS transistor N406.

A gate of the first NMOS transistor N401 is connected to a second terminal of the fourth constant current source I403, a drain of the tenth NMOS transistor N410, and a non-inverting input terminal of the comparator X401; a gate of the second NMOS transistor N402 is connected to a drain of the eleventh NMOS transistor N411, and an inverting input terminal of the comparator X401; a gate of the third NMOS transistor N403 and the gate of the fourth NMOS transistor N404 are both connected to a first signal CLK-P; a gate of the fifth NMOS transistor N405 and a gate of the sixth NMOS transistor N406 are both connected to a second signal CLK-N; phases of the first signal CLK-P and the second signal CLK-N are opposite; a source of the third NMOS transistor N403 is connected to a first terminal of the second constant current source I401, a source of the sixth NMOS transistor N406, and a drain of the ninth NMOS transistor N409; a source of the fourth NMOS transistor N404 is connected to a first terminal of the third constant current source I402, a source of the fifth NMOS transistor N405, and a drain of the eighth NMOS transistor N408; a gate of the tenth NMOS transistor N410 is connected to a gate of the eleventh NMOS transistor N411; a source of the first NMOS transistor N401, a source of the second NMOS transistor N402, a source of the seventh NMOS transistor N407, a source of the eighth NMOS transistor N408, a source of the ninth NMOS transistor N409, a second terminal of the second constant current source I401, and a second terminal of the third constant current source I402 are all connected to the ground GND; the first capacitor C401 has one terminal connected to the inverting input terminal of the comparator X401, and the other terminal connected to the ground GND; the second capacitor C402 has one terminal connected to the non-inverting input terminal of the comparator X401, and the other terminal connected to the ground GND; and the output terminal of the comparator X401 is connected to the accumulation and subtraction unit 103.

The third PMOS transistor P403 and the fourth PMOS transistor P404 form an input differential pair of the comparison unit. The third NMOS transistor N403, the fourth NMOS transistor N404, the fifth NMOS transistor N405 and the sixth NMOS transistor N406 are controlled by reverse clock switches respectively, which can reduce the offset. The second constant current source I401 and the third constant current source I402 on the differential tube are equal. It can be seen that, the comparison unit 101 and the control unit 102 provided in this embodiment include a plurality of transistors and unit resistors and few capacitor devices, reducing the manufacturing costs of the measurement circuit, and decreasing the area of the chip occupied by the measurement circuit. This is beneficial for integration.

Figure 5:
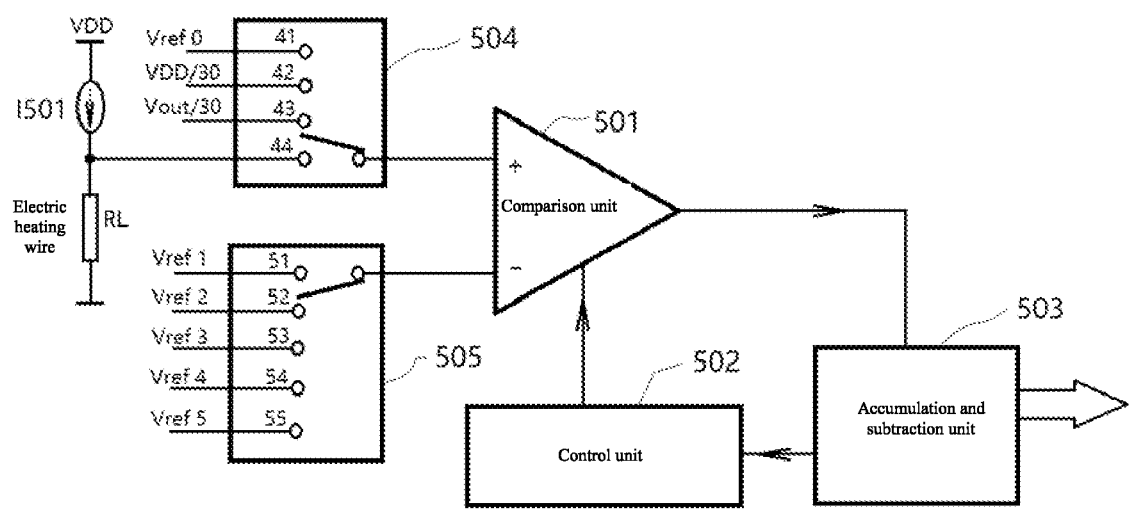
FIG. 5 is a schematic structural diagram of an electronic cigarette smoker according to an embodiment of the present invention.

Based on the same inventive concept, this embodiment also provides a measurement, method for measuring the electronic atomizer circuit. With reference to FIG. 5, the electronic atomizer circuit includes a power supply voltage VDD, a sixth constant current source I501, an electric heating wire RL, a first toggle switch 504, and a second toggle switch 505. The to-be-measured voltage in the electronic atomizer circuit includes: the power supply voltage VDD, the output voltage Vout, and the resistance value of the electric heating wire RL. Further, when the power supply voltage VDD is measured, the first toggle switch 504 selects the switch terminal 42, and the power supply voltage VDD is inputted to the first input terminal of the comparison unit 501. Usually, the power supply voltage VDD is within 5 V, and the one-thirtieth voltage may be inputted. The second toggle switch 505 selects a reference voltage source, such as 80, 120, 160, 200, and 240 mV, etc., to obtain a proper range. When the output voltage Vout is measured, the first toggle switch 504 selects the switch terminal 43, and the output voltage Vout is inputted to the first input terminal of the comparison unit 501. Usually, the output voltage Vout is also within 5V, and the one-thirtieth voltage may be inputted. The second toggle switch 505 selects a reference voltage source, such as 80, 120, 160, 200, and 240 mV, etc., to obtain a proper range. When the resistance value of the electric heating wire RL is measured, the first switch 504 selects the switch terminal 44, and the voltage across the electric heating wire RL is inputted to the first input terminal of the comparison unit 501. Because the resistance value of the tested electric heating wire RL is in the range of $0.5\Omega$ to $2\Omega$, the sixth constant current source I501 may be selected as 200 mA. The second toggle switch 505 selects a reference voltage source, such, as 80, 120, 160, 200, and 240 mV, etc., to obtain a proper range.

Further, with reference to FIGS. 5 to 10, the present invention provides a measurement method for the electronic cigarette circuit, including the following steps:

Step 1: Connect a first input, terminal of a comparison unit 501 to a first preset voltage, and connect a second input terminal of the comparison unit 501 to a second preset voltage; within a first predetermined time period, perform, by an accumulation and subtraction unit 503, counting, adjust, by a control unit 502, a voltage difference between the first input terminal and the second input terminal, to calculate a voltage resolution $\Delta$ of the control unit 102, determine whether the voltage resolution $\Delta$ is abnormal, and take a preset value of the voltage resolution $\Delta$ of the control unit 502 if the voltage resolution is abnormal.

Figure 6:
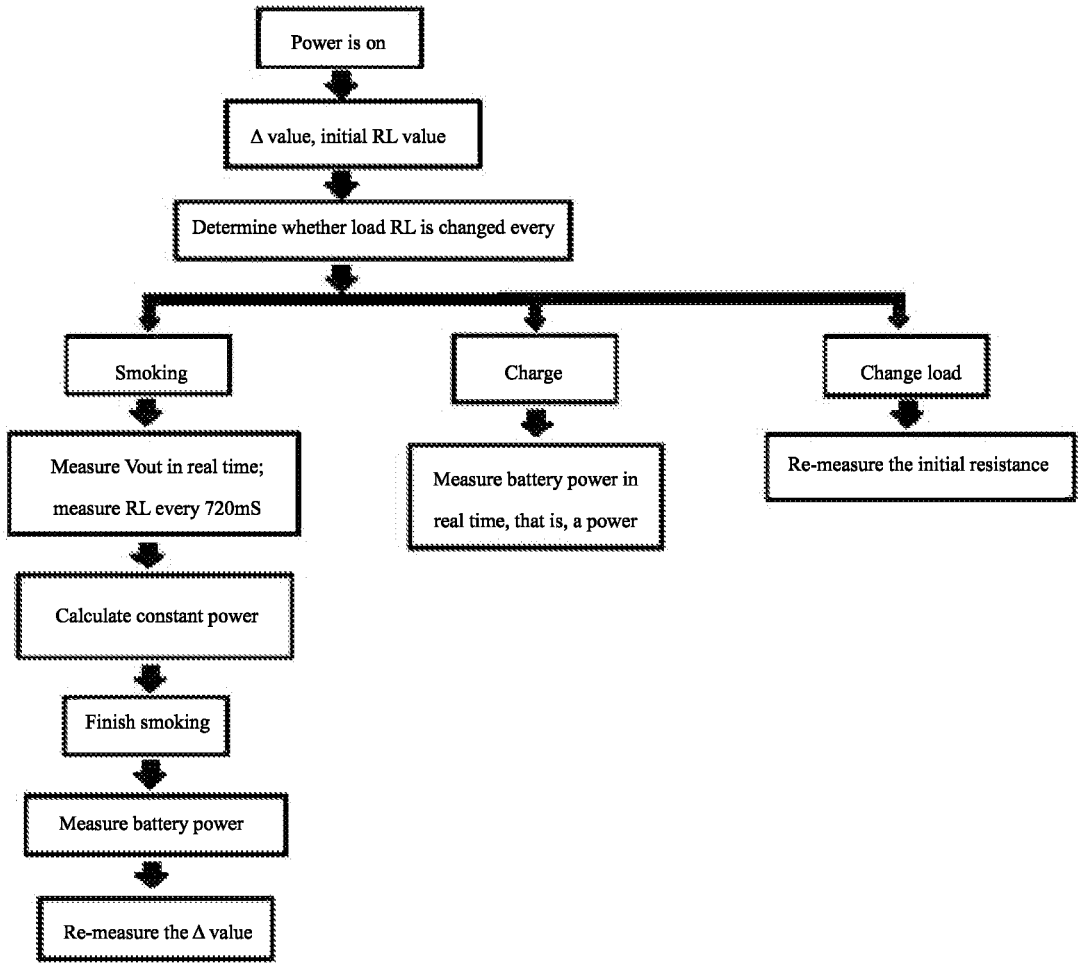
FIG. 6 is a schematic flowchart of a measurement method for the electronic cigarette smoker according to an embodiment of the present invention.
Figure 7:
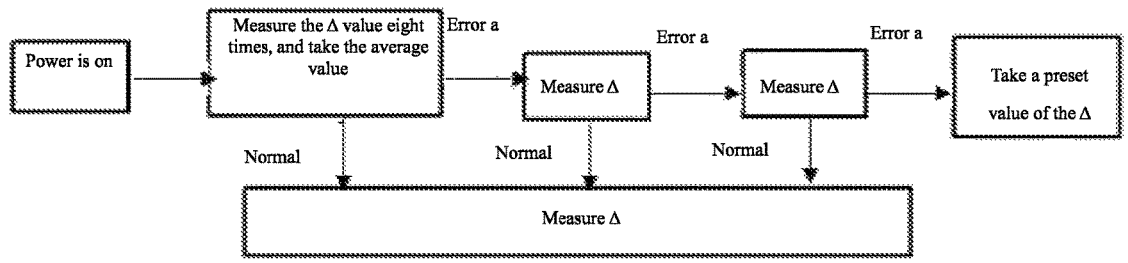
FIG. 7 is a schematic flowchart of a pre-measured voltage resolution according to an embodiment of the present invention.

Specifically, as shown in FIGS. 6 and 7, when the power is turned on for the first time, the voltage resolution $\Delta$ is pre-measured by using the first preset voltage and the second preset, voltage. Preferably, the voltage resolution $\Delta$ may be measured a plurality of times and the average value is taken. When an error a occurs, the voltage resolution $\Delta$ is measured a plurality of times. If the voltage resolution $\Delta$ is normal, the voltage resolution $\Delta$ is recorded. A preset value of the voltage resolution $\Delta$ is taken if the voltage resolution $\Delta$ is abnormal. The error a means that the measured value is beyond a specific range.

Step 2: Measure a resistance value of an electric heating wire RL in the electronic atomizer circuit, determine whether the resistance value is abnormal, if the resistance value is abnormal, replace the electric heating wire, and remeasure the resistance value of the electric heating wire RL.

Figure 8:
FIG. 8 is a schematic flowchart of measuring a resistance value of an electric heating wire according to an embodiment of the present invention.
Figure 9:
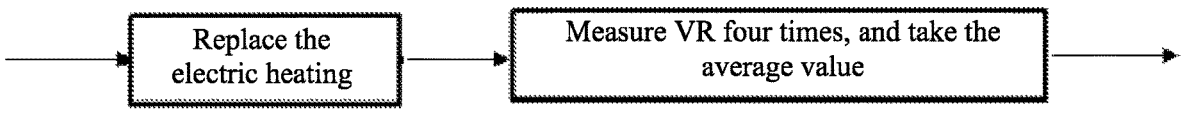
FIG. 9 is a schematic flowchart of measuring the resistance value after the electric heating wire is replaced according to an embodiment of the present invention.
Figure 10:
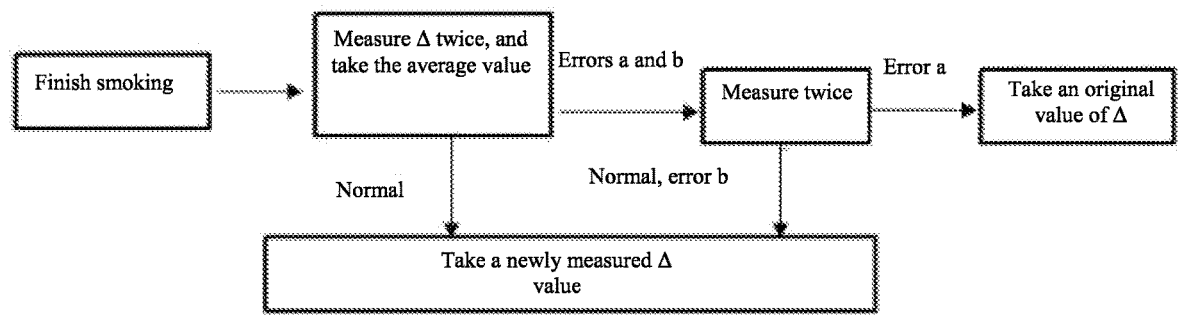
FIG. 10 is a schematic flowchart of measuring the voltage resolution after smoking according to an embodiment of the present invention.

As shown in FIGS. 8 and 9, after the power is turned on, the voltage resolution $\Delta$ is pre-measured, and then the resistance value of the electric heating wire RL is obtained by measuring the voltage across the heating wire RL. Preferably, the average value obtained in a plurality of measurements is taken as the resistance value of the electric heating wire RL. If the resistance value is not within the preset range, the electric heating wire RL is replaced, and the resistance value of the heating wire RL is re-measured until the set requirements are met.

Preferably, the resistance value of the heating wire RL may be monitored at a set interval to ensure product quality. For example, it, is determined whether the electric heating wire RL needs to be replaced every 120 ms.

Step 3: Measure a to-be-measured voltage to obtain a measurement value, where the to-be-measured voltage at least includes a power supply voltage VDD, an output voltage Vout, and a terminal voltage of the electric heating wire. Optionally, the power supply voltage VDD, the output voltage Vout, and the terminal voltage of the electric heating wire may be directly measured to obtain corresponding values.

Step 4: Connect the first input terminal of the comparison unit 501 to the to-be-measured voltage, and connect the second input terminal of the comparison unit 502 to a reference voltage; and within a second predetermined time period, perform, by the accumulation and subtraction unit 503, counting, adjust, by a control unit 502, a voltage difference between the first input terminal and the second input terminal, to calculate an actual value of the to-be-measured voltage.

The to-be-measured voltage in the electronic atomizer circuit includes: the power supply voltage VDD, the output voltage Vout, and the terminal voltage of the heating wire. For the specific measurement process, refer to the description about FIGS. 1 to 5 in this embodiment. That is, the first input terminal is connected to the power supply voltage VDD, the output voltage Vout, and the terminal voltage of the heating wire, and the corresponding actual voltage values are obtained through the measurement circuit.

Step 5: Correct the measurement value of the to-be-measured voltage according to the actual value of the to-be-measured voltage.

Because there is a polarization between the measurement value obtained in, step 3 and the measurement value obtained in step 4, the measurement value of the to-be-measured voltage needs to be corrected according to the actual value of the to-be-measured voltage, to ensure the measurement accuracy. The to-be-measured voltage satisfy the following formula:

$$Vp=Vn+M\times\Delta,$$

where $\Delta$ represents the voltage resolution, Vp represents the to-be-measured voltage, Vn represents the reference voltage, and M represents a difference between the counting result of the accumulation and subtraction unit and the initial count when the to-be-measured voltage is measured. M is a decimal value. If the counting result of the accumulation and subtraction unit is 6-bit, $Vp=Vn+\{A[5:0]-31\}/64\}\times\Delta$, where A is the binary count value outputted by the accumulation and subtraction unit.

Further, if the theoretical value of $\Delta$ is 20 mV in the measurement circuit, it may fluctuate between 19 mV–21 mV. Theoretically, when the voltage difference between the first, input terminal and the second input terminal is 200 mV, the output of the accumulation and subtraction unit should be 200/20=5. After direct measurement, $\Delta=I301\times R$ is 19 mV, the voltage difference between the first input terminal and the second input terminal is 200 mV, the output of the accumulation and subtraction unit should be 200/19=10.53. However, in the pre-measurement process: if the first input terminal Vref0=1.101 V, the second input terminal Vref1=1.000 V, and the output value of the accumulation and subtraction unit is 5.25, $$\Delta=I301\times R=(Vref0-Vref1)/D=(1.101-1.000)/5.25=0.0192V$$

It can be seen that there is a deviation among the theoretical value, the actual value, and the measured value of the voltage resolution. Therefore, when the voltage difference between the first input terminal and the second input terminal is 200 mV, the actual output of the accumulation and subtraction unit is 10.53×(5.00/5.25)=10.03.

Similarly, after measurement, $\Delta=I301\times R$ is 20.8 mV, the voltage difference between the first input terminal and the second input terminal is 200 mV, and the output of the accumulation and subtraction unit should be 200/20.8=9.62. In the pre-measurement process: if the first input terminal Vref0=1.101 V the second input terminal Vref0=1.000 V, and the output value of the accumulation and subtraction unit is 4.85, $$\Delta=I301/R=(Vref0-Vref1)/D=(1.101-1.000)/4.85=0.0208V.$$

It can be seen that the actual value of the voltage resolution is the same as the measured value, but there is a deviation between the actual value and the theoretical value. Therefore, when the voltage difference between the first input terminal and the second input terminal is 200 mV, the actual output of the accumulation and subtraction unit is 9.62×(5.00/4.85)=9.91.

Step 6: Calculate output power of the electronic atomizer circuit according to the corrected to-be-measured voltage; after smoking, connect the first input terminal of the comparison unit to the first preset voltage, and connect the second input terminal of the comparison unit to the second preset voltage; within a first predetermined time period, perform, by the accumulation and subtraction unit, counting, adjust, by the control unit, the voltage difference between the first input terminal and the second input terminal, to recalculate a voltage resolution of the control unit, determine whether the voltage resolution is abnormal, and update the voltage resolution of the control unit as an original value before the smoking if the voltage resolution is abnormal.

The constant output power P of the electronic atomizer circuit satisfies the following formula:

$$P=Vout^2/[(B\%)*(V_R/I501)],$$

where Vout represents the terminal voltage of the electric heating wire measured in real time during smoking, $V_R$ represents the measured voltage on the electric heating wire RL, I501 represents the current of the sixth constant current source, and may be 200 mA optionally, and B % is a set duty cycle. If $V_R/I501=1$, the constant power output is converted into a constant root-mean-square voltage output, and the size is $Vout\times(B\%)^{1/2}$.

Further, with reference to FIGS. 6 to 10, the electronic cigarette smoker may be in a smoking state, a charging state, and a replacement load state. During the smoking, the output voltage Vout may be measured in real time and the resistance value of the electric heating wire may be measured at intervals. In this case, the constant output power P may also be calculated to monitor whether the electronic cigarette works normally. After smoking, the power supply voltage VDD needs to be measured again to determine whether the smoker needs to be charged. In addition, the voltage resolution $\Delta$ is re-measured to update the voltage resolution $\Delta$ before the smoking. Preferably, the average value obtained in a plurality of measurements is taken as the voltage resolution $\Delta$. If an error a or an error b occurs, the measurement is performed again. If it is still abnormal, the voltage resolution $\Delta$ is set to the original value before smoking. To avoid system downtime, the next measurement is waited for. The error a means that the measured value is beyond a specific range, and the error b means that the difference between the measured value and the original value is large. In this embodiment, the measurement is performed 2, 4, 6, or 8 times. When the cigarette smoker is charged, the power supply voltage VDD of the measurement circuit may be measured in real time to determine whether it is fully charged, or whether the power supply voltage VDD is abnormal. After the electric heating wire RL is replaced, it is necessary to re-measure the resistance value of the electric heating wire RL to ensure the normal operation of the system.

In summary, according to the measurement circuit and the measurement method provided by this embodiment, a voltage resolution is pre-measured, avoiding the impact of the actual error of the first constant current source and the unit resistor on the actual voltage resolution, and ensuring the measurement accuracy. In addition, according to the reference voltage, the voltage resolution measured, and the counting result, a relatively accurate to-be-measured voltage can be obtained, to correct a measurement value of the to-be-measured voltage, thereby ensuring the high measurement accuracy of the to-be-measured voltage and the output power. In addition, the measurement method is simple to perform, which is beneficial to improve the measurement efficiency. Further, the comparison unit and the control unit include a plurality of transistors and unit resistors and few capacitor devices, reducing the manufacturing costs of the measurement circuit, and also decreasing the area of the chip occupied by the measurement circuit. This is beneficial for integration. Therefore, the measurement circuit and the measurement method provided by this embodiment can not only reduce the measurement costs of the electronic atomizer, but also improve the measurement accuracy and the measurement efficiency.

In addition, it should be known that although the present invention is disclosed above in preferable embodiments, the foregoing embodiments are not intended to limit the present invention. Anyone skilled in the related art, without departing from the scope of the technical solution of the present invention, may make possible changes and modifications to the technical solution of the present invention by using the technical content disclosed above, or modify the technical solutions into equivalent embodiments with equivalent changes. Therefore, any simple modifications, and equivalent changes and modifications made to the above embodiments according to the technical essence of the present invention without departing from the content of the technical solutions of the present invention still fall within the protection scope of the technical solutions of the present invention.

The invention claimed is:

1. A measurement circuit, comprising a comparison unit, an accumulation and subtraction unit, and a control unit, wherein
the comparison unit comprises a first input terminal, a second input terminal, and an output terminal; the first input terminal is connected to a to-be-measured voltage or a first preset voltage, the second input terminal is connected to a reference voltage or a second preset voltage, and the output terminal is connected to the accumulation and subtraction unit;
the accumulation and subtraction unit is configured to perform accumulation or subtraction counting according to an output value of the comparison unit, and input a counting result into the control unit;
the control unit comprises a first resistor series unit and a second resistor series unit, the first resistor series unit is connected to the first input terminal, and the second resistor series unit is connected to the second input terminal; and the control unit is configured to, according to the counting result, control the first resistor series unit or the second resistor series unit to be correspondingly connected to a resistance value of the first input terminal or the second input terminal, to adjust a voltage difference between the first input terminal and the second input terminal; and
according to the counting result and a difference between the first preset voltage and the second preset voltage, a voltage resolution of the control unit is calculated, and according to the voltage resolution, the counting result, and the reference voltage, the to-be-measured voltage is calculated.

2. The measurement circuit according to claim 1, wherein the first resistor series unit and the second resistor series unit each comprise $2^{n-1}$ unit resistors connected in series, the accumulation and subtraction unit performs counting in a binary manner, and n is a digit of the counting result.

3. The measurement circuit according to claim 2, wherein the control unit further comprises a first constant current source, a first switch array unit, and a second switch array unit; the first constant current source is connected to the first switch array unit and the second switch array unit; and the first switch array unit and the second switch array unit are connected to the first resistor series unit and the second resistor series unit respectively.

4. The measurement circuit according to claim 3, wherein the first switch array unit and the second switch array unit each comprise $2^{n-1}$ switches connected in parallel, and two adjacent switches are connected to two terminals of a same unit resistor respectively; and
a $2^{n-1}$th switch in the first switch array unit and a first switch in the second switch array unit are connected to two terminals of a $2^{n-1}$th unit resistor in the first resistor series unit; and a $2^{n-1}$th switch in the second switch array unit and the second input terminal are connected to two terminals of a $2^{n-1}$th unit resistor in the second resistor series unit respectively.

5. The measurement circuit according to claim 2, wherein when the to-be-measured voltage is larger than the reference voltage or the first preset voltage is larger than the second preset voltage, the output value of the comparison unit is at a high level, the counting result of the accumulation and subtraction unit is incremented by 1, the first resistor series unit increases one unit resistor to be connected to the first input terminal, or the second resistor series unit reduces one unit resistor to be connected to the second input terminal, to reduce the voltage difference between the first input terminal and the second input terminal by one voltage resolution; and
when the to-be-measured voltage is smaller than the reference voltage or the first preset voltage is smaller than the second preset voltage, the output value of the comparison unit is at a low level, the counting result of the accumulation and subtraction unit is decremented by 1, the first resistor series unit reduces one unit resistor to be connected to the first input terminal, or the second resistor series unit increases one unit resistor to be connected to the second input terminal, to increase the voltage difference between the first input terminal and the second input terminal by one voltage resolution.

6. The measurement circuit according to claim 1, wherein the voltage resolution and the to-be-measured voltage satisfy the following formula:

$$\Delta = (Vref0 - Vref1)/D; \text{ and}$$

$$Vp = Vn + M \times \Delta,$$

where $\Delta$ represents the voltage resolution, Vref0 represents the first preset voltage, Vref1 represents the second preset voltage, and D represents a difference between the counting result of the accumulation and subtraction unit and an initial count when the voltage resolution is measured; and Vp represents the to-be-measured voltage, Vn represents the reference voltage, and M represents a difference between the counting result of the accumulation and subtraction unit and the initial count when the to-be-measured voltage is measured.

7. The measurement circuit according to claim 1, wherein the comparison unit comprises a first transistor, a second transistor, a third transistor, and a fourth transistor; and the first input terminal is connected to a gate of the first transistor, the second input terminal is connected to a gate of the second transistor, the first resistor series unit, is connected to a source of the first transistor, the second resistor series unit is connected to a source of the second transistor, a drain of the first transistor is connected to a drain and the gate of the third transistor, a drain of the second transistor is connected to a drain of the fourth transistor and the accumulation and subtraction unit, a gate of the third transistor is connected to a gate of the fourth transistor, and a source of the third transistor and a source of the fourth transistor are both connected to the ground.

8. The measurement circuit according to claim 7, wherein the first transistor, and the second transistor are both PMOS transistors, and the third transistor and the fourth transistor are both NMOS transistors.

9. The measurement circuit according to claim 1, wherein the comparison unit comprises a first PMOS transistor, a second PMOS transistor, a third PMOS transistor, a fourth PMOS transistor, a first NMOS transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a first capacitor, a second capacitor, a second constant current source, a third constant current source, a fourth constant current source, a fifth constant current source, and a comparator;

a source of the first PMOS transistor, a source of the second PMOS transistor, a first terminal of the fourth constant current source, and a first terminal of the fifth constant current source are all connected to a power supply terminal, a gate and a drain of the first PMOS transistor are both connected to a gate of the second PMOS transistor, the drain of the first PMOS transistor is further connected to a drain of the first NMOS transistor and a drain of the second NMOS transistor, and a drain of the second PMOS transistor is connected to a drain and a gate of the seventh NMOS transistor, and a gate of the eighth NMOS transistor, and a gate of the ninth NMOS transistor; a source of the third PMOS transistor is connected to the first resistor series unit, a gate of the third PMOS transistor is connected to the to-be-measured voltage or the first preset voltage, a drain of the third PMOS is connected to a drain of the third NMOS transistor, a source of the tenth NMOS, and a drain of the fifth NMOS transistor; a source of the fourth PMOS transistor is connected to the second resistor series unit, a gate of the fourth PMOS transistor is connected to the reference voltage or the second preset voltage, and a drain of the fourth PMOS transistor is connected to a drain of the fourth NMOS transistor, a source of the eleventh NMOS transistor, and a drain of the sixth NMOS transistor; and a gate of the first NMOS transistor is connected to a second terminal of the fourth constant current source, a drain of the tenth NMOS transistor, and a non-inverting input terminal of the comparator; a gate of the second NMOS transistor is connected to a drain of the eleventh NMOS transistor, and an inverting, input terminal of the comparator; a gate of the third NMOS transistor and the gate of the fourth NMOS transistor are both connected to a first signal; a gate of the fifth NMOS transistor and a gate of the sixth NMOS transistor are both connected to a second signal; phases of the first signal and the second signal are opposite; a source of the third NMOS transistor is connected to a first terminal of the second constant current source, a source of the sixth NMOS transistor, and a drain of the ninth NMOS transistor; a source of the fourth NMOS transistor is connected to a first terminal of the third constant current source, a source of the fifth NMOS transistor, and a drain of the eighth NMOS transistor; a gate of the tenth NMOS transistor is connected to a gate of the eleventh NMOS transistor; a source of the first NMOS transistor, a source of the second NMOS transistor, a source of the seventh NMOS transistor, a source of the eighth NMOS transistor, a source of the ninth NMOS transistor, a second terminal of the second constant current source, and a second terminal of the third constant current source are all connected to the ground; the first capacitor has one terminal connected to the inverting input terminal of the comparator, and the other terminal connected to the ground; the second capacitor has one terminal connected to the non-inverting input terminal of the comparator, and the other terminal connected to the ground; and the output terminal of the comparator is connected to the accumulation and subtraction unit.

10. A measurement method for measuring an electronic atomizer circuit, wherein the measurement circuit according to claim 1 is used, and the measurement method comprises:

connecting a first input terminal of a comparison unit to a first preset voltage, and connecting a second input terminal of the comparison unit to a second preset voltage; within a first predetermined time period, performing, by an accumulation and subtraction unit, counting, adjusting, by a control unit, a voltage difference between the first input terminal and the second input terminal, to calculate a voltage resolution of the control unit, determining whether the voltage resolution is abnormal, and taking a preset value of the voltage resolution of the control unit to if the voltage resolution is abnormal;

measuring a resistance value of an electric heating wire in the electronic atomizer circuit, determining whether the resistance value is abnormal, if the resistance value is abnormal, replacing the electric heating wire, and remeasuring the resistance value of the electric heating wire;

measuring a to-be-measured voltage to obtain a measurement value, wherein the to-be-measured voltage at least comprises a power supply voltage, an output voltage and a terminal voltage of the electric heating wire of the electronic atomizer circuit;

connecting the first input terminal of the comparison unit to the to-be-measured voltage, and connecting the second input terminal of the comparison unit to a reference voltage; and within a second predetermined time period, performing, by the accumulation and subtraction unit, counting, adjusting, by a control unit, a voltage difference between the first input terminal and the second input terminal, to calculate an, actual value of the to-be-measured voltage;

correcting the measurement value of the to-be-measured voltage according to the actual value of the to-be-measured voltage;

calculating output power of the electronic atomizer circuit according to the corrected value of the to-be-measured voltage; and after smoking, connecting the first input terminal of the comparison unit to the first preset voltage, and connecting the second input terminal of the comparison unit to the second preset voltage; within a first predetermined time period, performing, by the accumulation and subtraction unit, counting, adjusting, by the control unit, the voltage difference between the first input terminal and the second input terminal, to recalculate a voltage resolution of the control unit, determining whether the voltage resolution is abnormal, and updating the voltage resolution of the control unit as an original value before the smoking if the voltage resolution is abnormal.

\* \* \* \* \*